United States Patent [19]

Fukui et al.

[11] Patent Number: 5,002,928
[45] Date of Patent: Mar. 26, 1991

[54] METHOD FOR FORMING OXIDE SUPERCONDUCTING FILMS WITH AN ULTRASONIC WAVE SPRAYER

[75] Inventors: Keitaro Fukui, Kamakura; Osamu Nakamura; Yasushi Okayama, both of Tokyo; Atsushi Tsunoda, Kamifukuoka, all of Japan

[73] Assignee: TOA Nenryo Kogyo Kabushiki Kaisha, Tokyo, Japan

[21] Appl. No.: 433,456

[22] Filed: Nov. 9, 1989

Related U.S. Application Data

[63] Continuation of Ser. No. 201,457, Jun. 2, 1988, abandoned.

[30] Foreign Application Priority Data

Jun. 4, 1987 [JP] Japan ................................. 62-139052

[51] Int. Cl.$^5$ ........................... B05D 5/12; B05D 3/12
[52] U.S. Cl. ........................................ 505/1; 505/737; 505/734; 427/62; 427/57; 427/226; 427/314; 427/110
[58] Field of Search ................... 505/1, 737, 734, 730; 427/62, 63, 314, 57, 110, 226, 168

[56] References Cited

U.S. PATENT DOCUMENTS

| | | | |
|---|---|---|---|
| 2,763,569 | 9/1956 | Bradstreet et al. | 427/314 |
| 3,840,391 | 10/1974 | Spitz et al. | 427/57 |
| 3,880,112 | 4/1975 | Spitz et al. | 118/323 |
| 4,336,242 | 6/1982 | Schmidberger et al. | 423/594 |
| 4,397,671 | 8/1983 | Vong | 427/314 |

FOREIGN PATENT DOCUMENTS

| | | |
|---|---|---|
| 0051767 | 5/1982 | European Pat. Off. . |
| 390595 | 8/1965 | Switzerland . |

OTHER PUBLICATIONS

Cooper et al., MRS Conf. on High Tc Superconductivity, Nov. 1987, pp. 165–170.
Meng et al., "Proceedings of the Beijing Int'l Workshop on High Tc Superconductivity," Jun. 1987, pp. 413–416.
Huggins et al., Ed., Annual Review of Materials Science, vol. 12, 1982, pp. 81–101.
Kawai et al., Jpn. J. Appl. Phys., vol. 26(10), Oct. 1987, L1740–1742.
Nishihara et al., Jpn. J. Appl. Phys., vol. 26(5), May 1987, L606–607.
Bednorz et al., Z. Phys. B-Consensed Matter, vol. 64, 1986, pp. 189–193, "Possible High $T_c$ Superconductivity in the Ba-La-Cu-O System".
Kishio et al., Chemistry Letters, 1987, pp. 429–432, "New High Temperature Superconducting Oxides".
Wu et al., Physical Review Letters, vol. 58, No. 9, 1987, pp. 908–910, "Superconductivity at 93K in a New Mixed-Phase Y-Ba-Cu-O Compound System at Ambient Pressure".
Kitazawa et al., Japanese Journal of Applied Physics, vol. 26, No. 4, Apr. 1987, pp. L339–L341, "Superconductivity at 95K in the New Yb-Ba-Cu Oxide System".
Takagi et al., Japanese Journal of Applied Physics, vol. 26, No. 5, May 1987, pp. L601–L602, "Bulk Superconductivity of Y-Ba-Cu-O and Er-Ba-Cu-O".
Koinuma, H. et al., Japanese Journal of Applied Physics, vol. 26, No. 5, Part 2, May 1987, pp. L761–L762.
Hamdi, A. H. et al., Applied Physic Letters, vol. 51, No. 25, Dec. 21, 1987, pp. 2152–2154.

Primary Examiner—Norman Morgenstern
Assistant Examiner—Roy V. King
Attorney, Agent, or Firm—Banner, Birch, McKie & Beckett

[57] ABSTRACT

A thin film of a superconductor comprising composite metal oxides is formed by atomizing and spraying a homogeneous solution or solutions containing as solutes one or more of metal compounds capable of forming the superconductor, with an ultrasonic wave sprayer, onto a hot substrate to form the thin film, and the ultrasonic wave sprayer for forming the thin film of the superconductor comprises an ultrasonic wave-generating vibrator, feedstock supplier, atomized solution-escaping inhibitor, substrate supporter and heater, the ultrasonic wave-generating vibrator being connected through an axis to a solution-atomizing nozzle.

8 Claims, 4 Drawing Sheets

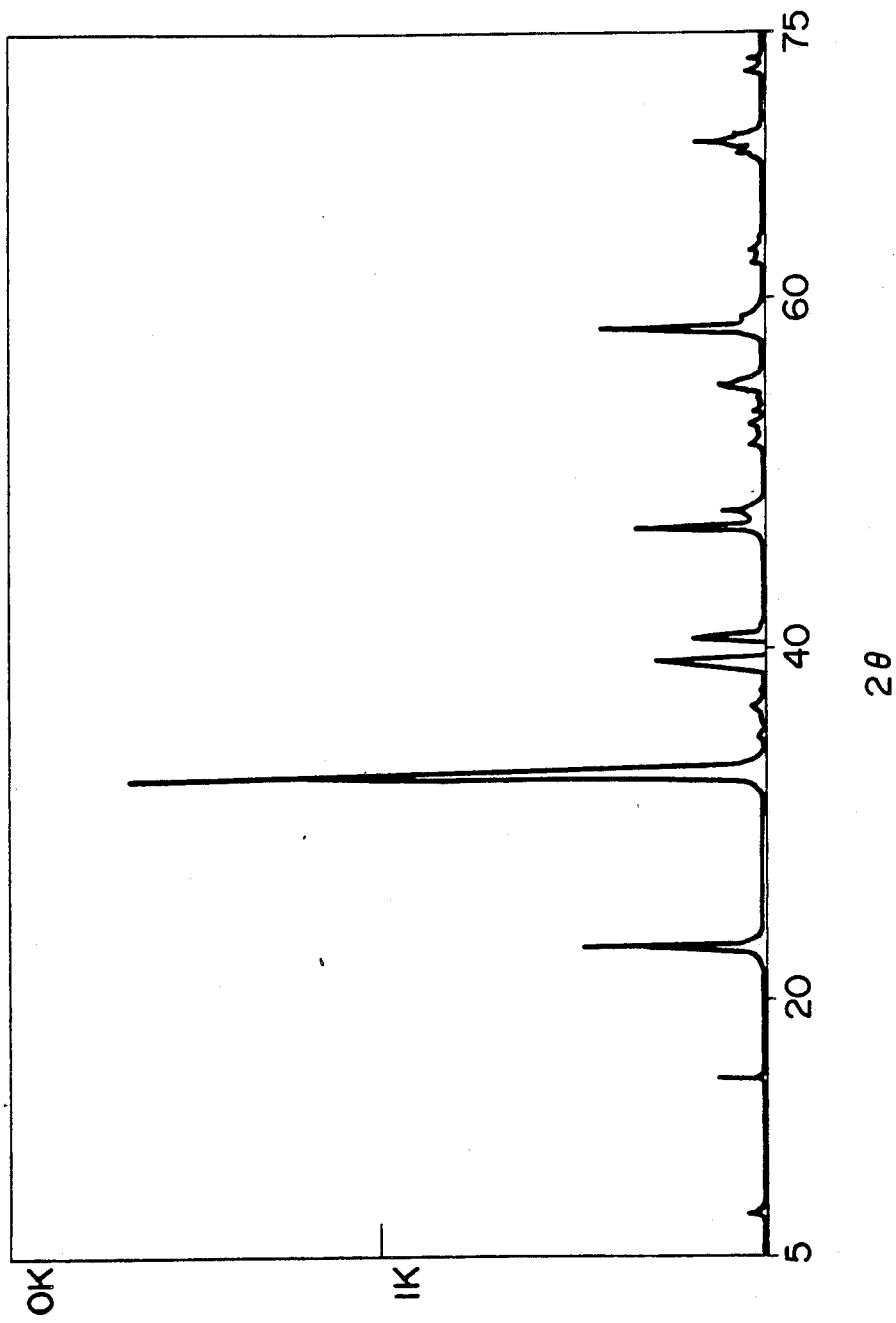

METHOD FOR FORMING OXIDE SUPERCONDUCTING FILMS WITH AN ULTRASONIC WAVE SPRAYER

This application is a continuation of application Ser. No. 201,457, filed June 2, 1988 now abandoned.

BACKGROUND OF THE INVENTION

1. Field of the Invention

This invention relates to a method for forming a superconductor thin film and an apparatus therefor, more particularly to a method for forming a thin film of a superconductor comprising a composite oxide containing an element such as a rare earth element, Bi or Tl, and an ultrasonic wave sprayer used therefor.

2. Descriptions of Related Art

Recently, many superconductive materials having a high critical temperature have been developed. For example, Dr. J. G. Bednorz et al of the Zurich Research of IBM reported that a barium-lanthanum-copper-oxygen composite metal oxide exhibited superconductivity at a relatively high temperature, 30 K (see Z. Phys. B-Condensed Matter, Vol. 64, 1986, pp. 189-193). Then, Dr. Tanaka et al of the Tokyo University reported that composite metal oxides represented by the formulae: $(La_{1-x}Sr_x)_2CuO_{4-\delta}$ and $(La_{1-x}Ca_x)_2CuO_{4-\delta}$ exhibited superconductivity at maximum temperature of 37 K and 18 K, respectively (see Chemistry Letters, 1987, pp. 429-432).

Furthermore, Dr. C. W. Chu et al of Houston University reported that they found a barium-yttrium-copper-oxygen composite metal oxide having a critical temperature of 93 K (see Phys. Rev. Letters, Vol. 58, 1987, pp. 908-910). Dr. Kitazawa et al of the Tokyo University reported a barium-ytterbium-copper oxide having a critical temperature of 95 K (see Jap. Journal of Appl. Phys., Vol. 26, Apr., 1987, pp. L339-L341), and Dr. Takagi et al reported that a barium-erbium-copper oxide had a critical temperature of 94 K (see Jap. Journal of Appl. Phys., Vol. 26, May, 1987, pp. L601-L602).

Instead of the rare earth elements above, it is expected that other rare earth element such as Lu, Tm, Ho, Dy, Cd, Nd, Sm or the like will be able to be introduced to obtain superconductors having a higher critical temperature.

Particularly, since a bismuth-strontium-calcium-oxygen superconductor is characterized by not only having a high zero-resistance temperature but also being stable to water, it is highly expectable for various applications. That is, this superconductor is said to be most practically used as electronic elements such as SQUID in which it is in a thin film form.

Also, a thallium-barium-calcium-copper-oxygen superconductor has a highest zero-resistance temperature among prior superconductors and, therefore, it is highly expectable as well as the bismuth-strontium-calcium-oxygen superconductor, although a thallium compound as a starting material is toxic.

These composite metal oxide superconductors are generally prepared by mixing and firing oxides, carbonates or the like of various metals constituting the superconductors.

For the formation of a superconductor thin film, evaporation or sputtering under vacuum has been tried directly on a substrate in a plate form. Introduction of a substrate in a wire form into a bath containing a molten superconductor has been tried to produce the superconductor thin film on the wire-like substrate.

However, the evaporation or sputtering under vacuum has such a drawback that it requires too high a degree of vacuum to produce the superconductor thin film with a high efficiency of production and further in a big size.

The introduction of the wire-like substrate into the bath containing a molten superconductor has such a drawback that the thin film obtained is uneven in thickness.

SUMMARY OF THE INVENTION

One object of the present invention is to provide a method for forming a uniform thin film of a composite metal oxide superconductor with a high efficiency of production.

Another object of the present invention is to provide an apparatus for forming the uniform thin film with a high efficiency of production.

The present inventors have found that a thin film of a composite oxide superconductor having a uniform thickness can stably be formed with a high efficiency of production by spraying onto a hot substrate a solution containing components for the superconductor with an ultrasonic wave sprayer under selected conditions.

In accordance with this invention, the above-mentioned objects can be achieved by spraying a homogeneous solution or solutions containing one or more components constituting the composite oxide superconductor on a hot substrate with an ultrasonic wave sprayer comprising an ultrasonic wave-generating vibrator, feedstock supplier, atomized solution-escaping inhibitor, substrate supporter and heater, the ultrasonic wave-generating vibrator being connected through an axis to a solution-atomizing nozzle.

BRIEF DESCRIPTIONS OF DRAWINGS

FIG. 5 is an X-ray diffraction pattern of the superconductor thin film formed in EXAMPLE 3.

DETAILED DESCRIPTIONS OF PREFERRED EMBODIMENTS

Figure 1:
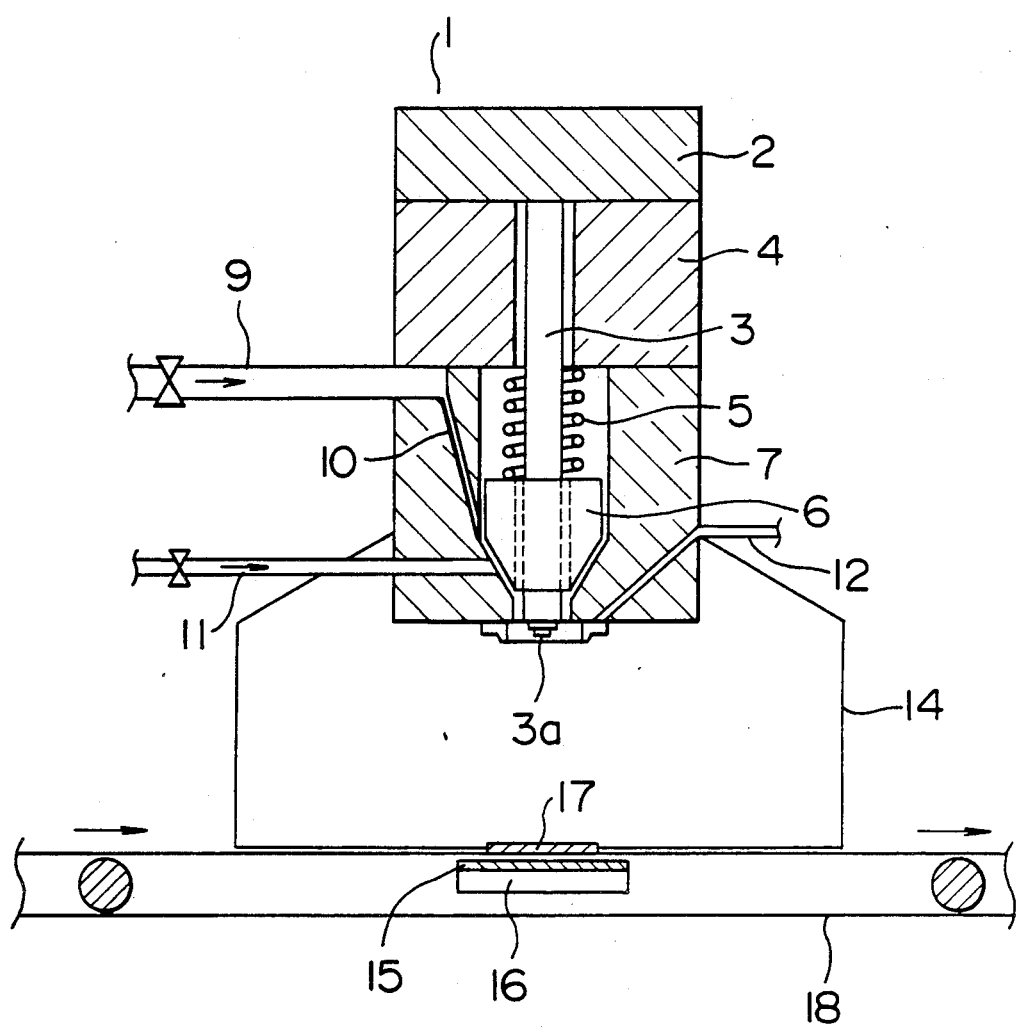
FIG. 1 is a schematical cross-sectional view of an example of the ultrasonic wave sprayer according to this invention.
Figure 2:
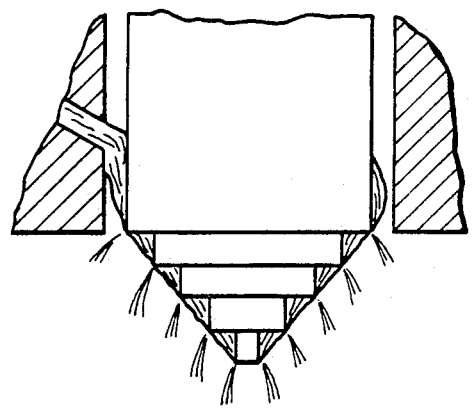
FIG. 2 is an enlarged view illustrating a state of solution when sprayed with a multistepped edged part.
Figure 3:
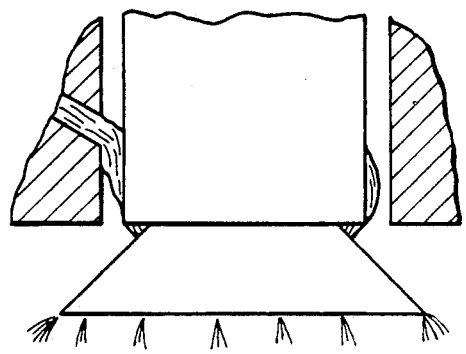
FIG. 3 is an enlarged view illustrating a state of solution when sprayed with a conically shaped edged part.

Superconductive materials used in this invention are not particularly limited, that is, they may be any materials containing a rare earth element, bismuth (Bi) or thallium (Tl).

When the rare earth element-containing materials are to be used to form the superconductor thin film according to this invention, a solution or solutions containing as solutes compounds of copper, an alkaline earth metal and the rare earth elements are used. In this case, the alkaline earth metal is preferably Ba. As the rare earth elements there may be one or more selected from the group consisting of Y, La, Lu, Yb, Tm, Er, Ho, Dy, Gd, Nd and Sm.

On the other hand, when the bismuth-containing materials are to be used to form the superconductor thin film according to this invention, a solution containing as solutes compounds of copper, at least two alkaline earth metals and bismuth is used. When the thallium-containing materials are to be used to form the superconductor thin film, a solution containing thallium instead of bismuth is used.

A solution containing bismuth, strontium, calcium and copper and a solution containing thallium, barium, calcium and copper are preferred.

These solutions are preferably sprayed in such a manner that the metal compounds are uniformly distributed on a substrate when sprayed on the hot substrate. If the solution is free of any metal compounds which coprecipitate together, it may be a mix solution which contains all metal compounds homogeneously solved therein. In this case, all the metal compounds are most uniformly distributed on the substrate, and the spraying can be carried out through one nozzle and, therefore, the structure and operation of a sprayer can be simplified. If metal compounds which coprecipitate together are used, then these compounds should be separately contained in respective solutions, or two or more metal compounds which do not coprecipitate together may be contained in one solution. These separate solutions may be sprayed through separate solution-atomizing nozzles.

However, these separate solutions are more advantageously sprayed while mixing one of the metal compounds which coprecipitate together with the other metal compounds at the edges of a nozzle than with a plurality of nozzles.

The metal compounds as the solutes in solutions to be sprayed may be metal salts, metal halides or metal alkoxides. As the salts, mention may be made of a nitrate, carbonate, sulfate, acetate or etc. Furthermore, a solvent may preferably be water, an alcohol or a mixture thereof. By using these solvents and solutes, the concentration of the solute in the solution can be made relatively high. Thus, an amount of the solution to be used can be reduced in forming a composite oxide thin film having a given thickness. The use of water or an alcohol as a solvent is not only economically preferred but also advantageous in that washing of the sprayer and recovering of the solvent can be carried out with ease. If these solvents do not permit any homogeneous solutions to be formed, however, they may be replaced with an organic solvent such as an aromatic hydrocarbon, e.g., toluene or benzene, ether or ester.

The concentration of the solute in the solution varies depending upon kinds of the metal compounds used, but it is preferably not less than 0.01 mol/l, more preferably 0.01 to 1.0 mol/l.

In this invention, the solution may be heated or cooled to adjust its temperature before spraying it. This solution temperature is normally in the range of 10° to 100° C., preferably 15° to 70° C.

In this invention, the solution is sprayed concentrically to a hot substrate through an ultrasonic wave sprayer.

The ultrasonic wave sprayer used in this invention is constituted by an ultrasonic wave-generating vibrator, feedstock supplier, atomized solution-escaping inhibitor, substrate supporter and heater, the ultrasonic wave-generating vibrator being connected to an axis to a solution-atomizing nozzle.

The ultrasonic wave-generating vibrator is a means for producing vibration capable of atomizing a liquid feedstock and well known.

The feedstock supplier is constituted by a tank, pump and valves.

The atomized solution-escaping inhibitor is a fence for effectively guiding the sprayed solution to the substrate.

The substrate supporter is a means for fixing the substrate in a plate or wire form to the sprayer to effectively deposit the atomized solutoin on the substrate.

The heater is a means for heating the substrate to a temperature of about 400° C. or higher, and it is normally provided in the vicinity of the substrate.

The sprayer of this invention is characterized in that the ultrasonic wave-generating vibrator has a nozzle for atomizing a solution or forming fine particles of solution.

FIG. 1 is a schematical cross-sectional view of an example of the ultrasonic wave sprayer used for forming a superconductor thin film according to this invention. The ultrasonic wave sprayer 1 is constituted by an ultrasonic wave-generating vibrator 2, which is connected to an end of vibrating axis 3. The other end of the axis 3 is provided with a nozzle 3a for atomizing a solution. Furthermore, the axis 3 penetrates from the ultrasonic wave-generating vibrator 2 through an external sheath body 4, a spring 5, one end of which is connected to the sheath body 4, and a hollow needle valve 6 provided at the other end of the spring 5, in this order to the nozzle 3a. This axis 3 can freely be vibrated without any adverse effects of the external sheath body 4, spring 5 and hollow needle valve 6. A portion of the hollow needle valve 6 is in a cylindrical form and the end of the axis has a projected edge. Furthermore, when no spraying is carried out, this hollow needle valve 6 is slidably mated with a hollow needle valve holder 7 which is integrated with the external sheath body 4. A flow path 9 for the solution is provided between the hollow needle valve holder 7 and the external sheath body 4 is connected to a solution-supplying path 10 penetrating through the hollow needle holder 7. One end of this solution-supplying path 10 is in the vicinity of the position at which the outer diameter of the hollow needle valve 6 begins to be reduced, and the opening of the path 10 is closed with the needle valve 6 when the needle valve 6 and the needle valve holder 7 are mated with each other.

In the ultrasonic wave sprayer according to this invention, vibration made by operating the ultrasonic wave-generating vibrator 2 is propagated through the vibrating axis 3 to the solution-atomizing nozzle 3a. When a feedstock solution is supplied into the path 9 to reach a pressure above the forcing pressure of the spring 5, the hollow needle valve 6 is slided and floated up against the forcing pressure of the spring, so that the path 10 is released from the needle valve 6 to introduce the feedstock solution along the wall of the hollow needle valve holder 7 to the solution-atomizing nozzle 3a. The solution is atomized by the ultrasonic wave vibration of the solution-atomizing nozzle 3a. The atomized fine particles are sprayed from the nozzle 3a and introduced by a carrier gas from a gas-supplying path 12 onto a substrate 17 on a substrate supporter 15, optionally provided on the backside thereof with a heater 16. In this invention, the flow rate of the solution can strictly be regulated by the hollow needle valve, but this hollow needle valve is not always needed.

The atomized solution is sorrounded by a solution-escaping inhibitor or fence 14.

The solution-atomizing nozzle of the ultrasonic wave sprayer has a multistepped edged part, conically shaped edged part or horn-shaped edged part, which is preferred because such nozzle can conveniently atomize a great amount of the solution in fine particles having a uniform particle-size distribution at its edges. The multistepped edged part has two or more edged steps, preferably 2 to 5 edged steps, as shown in FIG. 2. The side wall of the conically shaped edged part has a straight busbar, as shown in FIG. 3 and the side wall of the horn-shaped edged part has a curved busbar.

FIG. 2 is an enlarged view illustrating a state of solution when sprayed with the multistepped edged part.

FIG. 3 is an enlarged view illustrating a state of solution when sprayed with the conically shaped edged part.

As the carrier gas used for entraining and carrying the atomized solution to the substrate there is normally used air, but it may be an oxygen-rich gas. Since the carrier gas is merely used for carrying the atomized particles, it may be nitrogen or other inert gases. If air or an oxygen-rich gas is used, the firing step can simultaneously be carried out.

In this invention, the particle size of the atomized fine particles is generally in the range of 0.5 to 1,000 μm, preferably 1 to 300 μm, more preferably 5 to 100 μm. There fine particles are sprayed in the flow rate of 0.1 to 100 ml/min, preferably 0.5 to 50 ml/min.

Conditions such as the particle size and generated amount of the atomized particles can optionally be regulated by selecting a kind of a solute and solvent, spraying pressure of a solution, kind of a carrier gas, frequency of vibration and etc.

Around the nozzle for spraying the solution and the hot substrate there is provided an atomized solution-escaping inhibitor which is a surrounding wall having an inlet and outlet through which a carrier gas is permitted to pass so as not to prevent the solution from being sprayed onto a hot substrate. The surrounding wall can improve an efficiency of forming a film by about 3 to 30%. The temperature of a spraying atmosphere may be regulated by a carrier gas supplier provided with a regulator for a carrier gas flow rate and/or a heater and cooler for the carrier gas. The carrier gas supplier can always keep the atmosphere in the vicinity of the substrate fresh, which can, therefore, promote the thermal decomposition of the solute. This reaction may be carried out either under pressure or reduced pressure, as desired. In this case, conditions, such as temperature and pressure, of the sprayed solution vary depending upon a distance between the spraying nozzle and the hot substrate, and a surface area and temperature of the hot substrate and are not particularly limited. However, such conditions directly under the nozzle are generally a temperature of preferably 10 to 800° C., more preferably 100° to 500° C. and a pressure of 0.5 to 5 atm, more preferably 1 to 3 atm.

In accordance with this invention, the spraying is carried out by an ultrasonic wave sprayer having a solution-atomizing nozzle and, therefore, the atomized solution cannot only continuously be sprayed at a constant rate but also the size and flow rate of the atomized solution can be adjusted by regulating the power of the ultrasonic wave-generating vibrator. Furthermore, the use of the carrier gas permits a highly uniform film to form over a great surface area.

In accordance with this invention, the substrate is heated to a high temperature to allow the reaction of the solute and the solvent in the atomized solution to take place on the substrate. Thus, the substrate should be heat-resistant. Furthermore, the substrate is preferably in a plate-like or wire-like shape and made of a ceramics such as zirconia, magnesia, quartz glass, crystalline silicon, alumina and etc., more preferably yttria-stabilized zirconia and magnesia. The substrate made of quartz glass or crystalline silicon is reactive with the superconductor. Therefore, a buffer layer should preferably be preformed to cover the substrate therewith.

As a material for the buffer layer is used platinum (Pt), magnesia (MgO) or calcium fluoride ($CaF_2$). The buffer layer may be formed on the substrate by evaporation or sputtering.

If the substrate is in a wire form, it may be made of a metal such as copper, aluminum or silver, or alloys thereof or a ceramics such as alumina or a metal nitride. The substrate in a wire form may also be beforehand covered with a layer having an affinity with the superconductor. The covering layer may function as a buffer layer. The covering layer may have an even or moderately uneven surface.

The substrate may be fixed onto the supporter in the ultrasonic wave sprayer of this invention, or travelled on the supporter in a given direction through the ultrasonic wave sprayer. In the case that the substrate is in a card or disk shape, it may be heated and sprayed batchwise or continuously while being travelled on a belt conveyer. In the case that the substrate is in a coiled strip or wire shape, it may continuously be heated and sprayed while being supplied at one end of the sprayer and coiled at the other end.

The thickness of the superconductor thin film on the substrate can be adjusted normally to 0.1 to 200 μm, preferably 1 to 100 μm.

The surface temperature of the substrate is maintained at a temperature of 100° C. or higher, preferably 200° to 950° C., more preferably 300° to 800° C. while the feedstock solution is being sprayed. The heating may be carried out by a heater, which is built in the substrate supporter. It is preferred that the solute is allowed by raising up the substrate temperature to be decomposed immediately when deposited on the substrate to form a composite metal oxide. Where the substrate temperature is sufficiently high, the main firing is not always needed, but where the substrate temperature is low, the spraying should be followed by the main firing at a temperature of 700° to 1050° C., preferably 800° to 900° C. for a period of 1 minute to 10 hours, preferably 3 minutes to 2 hours and then, as desired, the slow cooling to about 500° C. for annealing.

In the case of the substrate in a coiled strip or wire-like shape, the composite metal oxide deposited on the substrate is coated with a polymer compound. The kind of the polymer compound is not particularly limited, but it is desirably hydrophobic, in view of the fact that the wire is used as a superconductor in a highly cooled state and heated when the cooling is ceased, so that water droplets are condensed on the wire. Such polymer compounds may be, for example, polyvinyl chloride, polyolefins such as polyethylene, polyimides, PPS or the like. Among these compounds can be selected ones having an affinity with the composite metal oxides and a high mechanical strength. Application of the polymer compound to the strip or wire-like substrate makes the release of the superconductor thin film from the substrate hard and allows the strip or wire to be coiled up.

As is clear from the foregoing, this invention makes it possible to simply and cheaply produce a superconductor thin film comprising a specified composite metal oxide and having a uniform thickness in a continuous manner.

This invention will be illustrated below with reference to some examples and comparative examples. However, this invention is not limited to these examples.

EXAMPLE 1

The ultrasonic wave sprayer 1 as shown in FIG. 1 was used. The solution-atomizing nozzle 3a was vibrated with the ultrasonic wave-generating vibrator 2 at an amplitude of 20 μm and a frequency of vibration of 40 kHz. An aqueous solution containing 0.1 mol/l of strontium chloride ($SrCl_2$), 0.1 mol/l of barium chloride ($BaCl_2$) and 0.2 mol/l of cupric chloride ($CuCl_2$) was supplied at 18° C. at a flow rate of 2.5 ml/min. through flow path 9, while an aqueous solution containing 0.1 mol/l of bismuth nitrate was supplied at a flow rate of 2.5 ml/min. through flow path 11 so as to mix them immediately before the nozzle. The resultant mix solution was atomized in fine particles of 30 μm in average size and continuously sprayed at a solution flow rate of 5 ml/min. for 25 minutes onto a zirconia substrate in a plate form at 410° C. A carrier gas was air and supplied at 5 l/min.

The thus obtained thin film-deposited substrate was preheated at about 800° C. for 2 hours, then fired at about 880° C. for 1 hour and furnace-cooled to room temperature.

The thus obtained thin film on the substrate was uniform and about 30 μm in thickness.

The zero-resistance temperature of this thin film was determined to be about 65 K.

EXAMPLE 2

Figure 4:
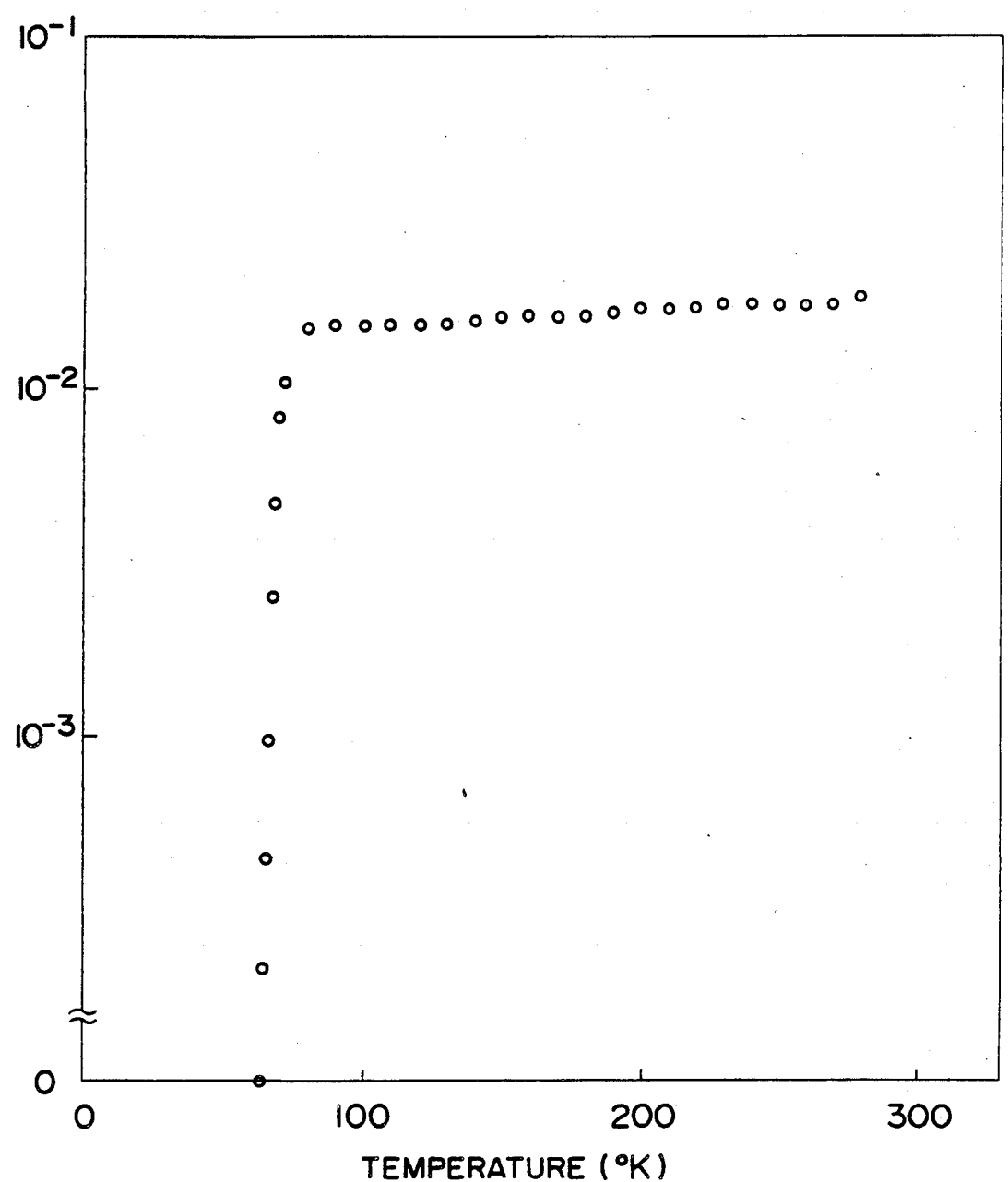
FIG. 4 is a graph showing a relation between temperatures and resistances of the bismuth-containing superconductor thin film formed in EXAMPLE 2.

An aqueous solution containing 0.1 mol/l of bismuth nitrate, calcium nitrate, strontium nitrate and copper nitrate in a molar ratio of 1:1:1:2 was used at 20° C., atomized with ultrasonic wave at a power of 100 W and a frequency of vibration of 28 kHz in approximately uniformly fine particles of 50 μm in average size and sprayed at a flow rate of 2 ml/min. with air as a carrier gas at 5 l/min. (under normal condition) onto a yttrias-tabilized zirconia substrate heated to 430° C. to form a thin film on the substrate. The other conditions were identical with those of EXAMPLE 1. The thin film on the substrate was fired at 880° C. for 30 minutes and then allowed to cool in a furnace. The thus obtained thin film had a thickness of 21 μm and exhibited a change of resistance with temperatures as shown in FIG. 4. From FIG. 4 it is clear that the resistance is completely zero at 63.8 K. A temperature, $Tc_{onset}$, at which the resistance abruptly began to be reduced, was 96 K.

COMPARATIVE EXAMPLE 1

Figure 6:
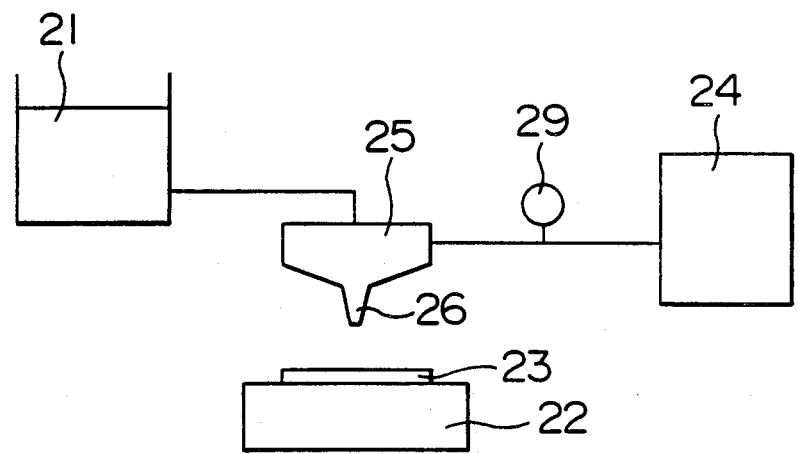
FIG. 6 is a schematical view of the sprayer used in COMPARATIVE EXAMPLES.

The same aqueous solution as used in EXAMPLE 2 was introduced into solution tank 21 of a sprayer as shown in FIG. 6. This solution tank 21 was connected to spraying nozzle 26 which was also connected via flowmeter 29 to compressor 24. A substrate 23 of zirconia was placed on heater 22 and maintained at about 430° C. with the heater. Compressor 24 was operated to allow compressed air to flow into sprayer 25, and the solution was sprayed onto the hot substrate 23. The spraying was carried out for about 10 seconds per one time and 10 times repeated at an interval of 60 seconds to form a thin film on the substrate.

The thin film on the substrate was fired and then allowed to cool in the same manner as in EXAMPLE 2.

The thus obtained thin film had a thickness of about 20 μm and a zero-resistance temperature of about 55° K.

EXAMPLE 3

The same ultrasonic wave sprayer 1 as used in EXAMPLE 1 was used and the atomizing nozzle 3a was vibrated under the same conditions as in EXAMPLE 1. An aqueous solution containing 0.1 mol/l of yttrium chloride ($YCl_3$), 0.2 mol/l of barium chloride ($BaCl_2$) and 0.3 mol/l of cupric chloride ($CuCl_2$) dissolved therein was supplied at 20° C. The atomized solution was continuously sprayed at a flow rate of 2.5 ml/min. for 20 minutes onto a substrate of zirconia placed directly under the nozzle of the sprayer 1 and heated to 400° C. The carrier gas used was air as in EXAMPLE 1, which was supplied and flow rate of 5 l/min.

The thus obtained thin film-deposited substrate was preheated at about 800° C. for 2 hours, fired at about 940° C. for 1 hour and then annealed at about 550° C. for 5 hours.

The thus obtained thin film was uniform and had a thickness of about 20 μm. It was confirmed by X-ray diffraction to have a crystal structure of the oxygen deficient three layered perovskite structure. The X-ray diffraction pattern is shown in FIG. 5.

The magnetic susceptibility of this thin film was determined to show that the critical temperature of superconductor was about 92 K.

EXAMPLE 4

As a substrate was used a quartz glass plate, which had a MgO buffer layer of 3 μm in thickness, was heated to 650° C. The procedures of EXAMPLE 3 were repeated, except that the flow rates of the solution was 2 ml/min., an ultrasonic wave generated at a power 100 W and a frequency of vibration of 28 kHz and the spraying was carried out for 20 minutes. The thin film thus deposited on the substrate was heat treated in the same manner as in EXAMPLE 3 to have a composition of yttrium, barium and copper composite oxides and a thickness of about 12 μm. The magnetic susceptibility of the thin film was determined to show that the critical temperature of superconductor was about 78 K.

COMPARATIVE EXAMPLE 2

With the same sprayer as used in COMPARATIVE EXAMPLE 1 a thin film having a composition of yttrium, barium and copper composite oxides and a thickness of about 14 μm was deposited on a substrate under approximately the same conditions as in EXAMPLE 4.

That is, the substrate was heated to about 650° C., and the solution was atomized at a flow rate of about 2 ml/min. through a spraying nozzle having an aperture of 200 μm in diameter. The atomized particles had a broad particle size distribution of about 10 to 500 μm.

The atomized solution was sprayed onto the hot substrate with air compressed at about 2 kg/cm²G. This spraying was continued and then the same heat treatment as in EXAMPLE 3 carried out to form a thin film having a thickness of about 14 μm and a composition of yttrium, barium and copper composite oxides on the substrate. The zero-resistance temperature of the thin film was about 55 K.

EXAMPLE 5

An aqueous solution having the same composition containing Bi, Sr, Ca and Cu component as used in EXAMPLE 2 was sprayed with an ultrasonic wave sprayer onto a silver wire substrate of 3 mm in diameter.

The spraying was carried out in an atmosphere at 600° C. and the sprayer was continuously operated.

The substrate was transferred to a furnace immediately after a uniform thin film of about 10 μm in thickness was obtained, then fired at 850° C. for 1 hour and then furnace cooled.

The zero-resistance temperature was 70 K.

In another example, a thin film was formed on a substrate under entirely the same conditions with a sprayer using compressed air, not with an ultrasonic wave sprayer. This thin film was less uniform than that of the thin film obtained with the ultrasonic wave sprayer. The zero-resistance temperature of this thin film was 58 K.

What is claimed is:

1. A method for forming a thin film of an oxide superconductor which comprises atomizing and spraying a homogeneous solution with a ultrasonic wave sprayer onto a substrate heated to a temperature of 200° to 950° C. to form an oxide film and then annealing said film, wherein said solution is selected from the group consisting of metal salts, metal halides, metal alkoxides and mixtures thereof capable of forming the superconductor.

2. The method according to claim 1, wherein the substrate is in a plane form or wire form.

3. The method according to claim 1, wherein said superconductor has a zero-resistance temperature of 58° K or higher.

4. The method according to claim 1, wherein said thin film has a thickness of 0.1 to 200 microns.

5. The method according to claim 1, wherein the atomizing and spraying is effected in a continuous manner.

6. The method according to claim 1, wherein said solution is atomized and sprayed at a flow rate of 0.1 to 100 ml/min.

7. The method according to claim 1, wherein the atomized solution has particle size in the range of 0.5 to 1,000 microns.

8. The method according to claim 1, wherein said metal salts, metal halides and metal alkoxides are selected from the group consisting of a bismuth compound, a thallium compound, a yttrium compound, a copper compound, an erbium compound, a strontium compound, a calcium compound, a barium compound, a samarium compound, a holmium compound, a lanthanum compound, a lutetium compound, a neodynium compound, a terbium compound, a ytterbium compound, and mixtures thereof capable of forming the superconductor.

* * * * *